United States Patent
VanHouten et al.

(10) Patent No.: US 8,733,828 B2
(45) Date of Patent: May 27, 2014

(54) HEADLINER WITH INTEGRAL WIRE HARNESS

(75) Inventors: Dennis J. VanHouten, Wyoming, MI (US); Christopher S. Kring, Zeeland, MI (US); Ben Sapak, Holland, MI (US); Jack L. Johnson, Holland, MI (US)

(73) Assignee: Johnson Controls Technology Company, Holland, MI (US)

( * ) Notice: Subject to any disclaimer, the term of this patent is extended or adjusted under 35 U.S.C. 154(b) by 204 days.

(21) Appl. No.: 13/143,377

(22) PCT Filed: Jan. 5, 2010

(86) PCT No.: PCT/US2010/020090
§ 371 (c)(1),
(2), (4) Date: Sep. 21, 2011

(87) PCT Pub. No.: WO2010/080750
PCT Pub. Date: Jul. 15, 2010

(65) Prior Publication Data
US 2012/0001457 A1    Jan. 5, 2012

Related U.S. Application Data (60) Provisional application No. 61/142,769, filed on Jan. 6, 2009.

(51) Int. Cl.
*B60R 13/02* (2006.01)
*B62D 25/06* (2006.01)

(52) U.S. Cl.
USPC .......................................... 296/214; 296/210

(58) Field of Classification Search
USPC ................ 296/210, 214, 39.1, 39.3
See application file for complete search history.

(56) References Cited

U.S. PATENT DOCUMENTS

| | | | | |
|---|---|---|---|---|
| 4,764,848 A | * | 8/1988 | Simpson | 361/776 |
| 5,357,408 A | * | 10/1994 | Lecznar et al. | 362/490 |
| 5,484,186 A | * | 1/1996 | Van Order et al. | 296/97.5 |
| 5,825,096 A | * | 10/1998 | Morimoto et al. | 307/9.1 |

(Continued)

FOREIGN PATENT DOCUMENTS

| | | |
|---|---|---|
| EP | 0999950 B1 | 5/2004 |
| JP | 10-307180 | 12/1989 |

(Continued)

OTHER PUBLICATIONS

International Search Report & Written Opinion dated Feb. 17, 2010.

(Continued)

*Primary Examiner* — Glenn Dayoan
*Assistant Examiner* — Gregory Blankenship
(74) *Attorney, Agent, or Firm* — Michael Best & Friedrich LLP (57) ABSTRACT

This invention relates to a roof structure in a vehicle, wherein the roof structure (100) is provided with printed electrical connection means (110) for connecting electrical devices in the vehicle. The invention further relates to a method for manufacturing such a roof structure and to a system comprising an electrical device, a roof structure (100) with printed electrical connection means (110), a printed conductive pad (112, 212, 312, 412) and an electrical connector, wherein the electrical connector (530, 730) is pierced through the roof structure (100) to connect the electrical device with the conductive pad (112, 212, 312, 412).

14 Claims, 7 Drawing Sheets

(56) References Cited

U.S. PATENT DOCUMENTS

| | | | |
|---|---|---|---|
| 5,887,939 A * | 3/1999 | Yamaguchi et al. | 296/210 |
| 6,120,091 A * | 9/2000 | Reich et al. | 296/214 |
| 6,126,228 A * | 10/2000 | Davis et al. | 296/146.7 |
| 6,273,499 B1 * | 8/2001 | Guyon | 296/214 |
| 6,317,548 B1 * | 11/2001 | Rockwell et al. | 385/123 |
| 6,513,959 B2 * | 2/2003 | Serizawa et al. | 362/490 |
| 6,582,013 B1 * | 6/2003 | Inoue et al. | 296/214 |
| 6,612,640 B2 * | 9/2003 | Hock et al. | 296/146.7 |
| 6,652,021 B1 * | 11/2003 | Dykman et al. | 296/214 |
| 6,824,185 B2 * | 11/2004 | Tiesler et al. | 296/37.8 |
| 6,884,084 B2 * | 4/2005 | Shields | 439/34 |
| 6,886,956 B2 * | 5/2005 | Parker et al. | 362/29 |
| 6,957,839 B1 * | 10/2005 | Tiesler et al. | 296/24.34 |
| 7,014,259 B2 * | 3/2006 | Heholt | 296/214 |
| 7,052,068 B2 * | 5/2006 | Sturt et al. | 296/37.7 |
| 7,186,136 B2 * | 3/2007 | Tiesler et al. | 439/493 |
| 2004/0222673 A1 * | 11/2004 | Brown | 296/214 |
| 2006/0021861 A1 * | 2/2006 | Schmidt et al. | 200/5 R |
| 2006/0061145 A1 * | 3/2006 | Strebe et al. | 296/214 |
| 2008/0083720 A1 | 4/2008 | Gentile et al. | |
| 2008/0093890 A1 | 4/2008 | Mehling | |
| 2012/0001457 A1 * | 1/2012 | VanHouten et al. | 296/214 |

FOREIGN PATENT DOCUMENTS

| | | |
|---|---|---|
| JP | 2002-002378 | 1/2002 |
| JP | 2002-157922 | 5/2002 |
| JP | 2002-225645 | 8/2002 |
| JP | 2004-184741 | 7/2004 |
| JP | 2005-039083 | 2/2005 |
| JP | 2007-173342 | 7/2007 |
| JP | 2007-292678 | 11/2007 |
| JP | 2008-531361 | 8/2008 |
| JP | 2009-527419 | 7/2009 |
| WO | 92/20489 | 11/1992 |
| WO | 2006-091031 | 8/2006 |
| WO | 2007-098325 | 8/2007 |
| WO | 2010/080750 A1 | 7/2010 |

OTHER PUBLICATIONS

International Preliminary Report on Patentability dated Jul. 21, 2011.

* cited by examiner

HEADLINER WITH INTEGRAL WIRE HARNESS

CLAIM OF PRIORITY

This application claims priority from provisional application Ser. No. 61/142,769 filed 6 Jan. 2009, and is a national application based on PCT Application International Application PCT/US2010/020090, filed 5 Jan. 2010 (published as WO2010/080750), all incorporated herein by reference.

BACKGROUND

1. Field of the Invention

This invention relates to a roof structure, especially a vehicle overhead system including a headliner with an integral wire harness, a method for manufacturing this roof structure and a system comprising such a roof structure, a connector and a conductive pad.

2. Related Art

Many vehicle overhead systems include electrical wiring behind the vehicle headliner to provide power to and/or communication with various controls, such as, for example, garage door opener or compass, and/or features such as, for example, a dome light. With conventional overhead systems, standard wires such as, for example, stranded, insulated copper or other metallic wires, are installed between the headliner and the vehicle roof.

Overhead systems are currently installed in motor vehicles in a series of steps at a plurality of stations on a vehicle assembly line. Individual overhead system components that require electricity as a power source or to provide a signal are individually connected to the vehicle body electrical system at the time of assembly. A wire harness, including all of the wiring necessary for the overhead system components, is attached to the back of the headliner with, for example, tape or hot melt glue. The various wires forming the wire harness are typically located between the headliner and the roof of the vehicle. When the wires are located between the headliner and the roof, they sometimes contact the roof structural supports. This contact between the wire and the roof structural supports may result in the wire being pinched, cut, or having the insulation rubbed off to cause a short circuit as the wire contacts the vehicle body. The insulation and/or other wrappings required for traditional wire harnesses also add significantly to headliner weight.

SUMMARY

This invention relates to a roof structure in a vehicle, wherein the roof structure is provided with printed electrical connection means for connecting electrical devices in the vehicle. In the context of the present invention the roof structure comprises any structure or layer that is arranged in the roof area of the vehicle. Printing or printed in this context comprises any application of conductive means to a surface. Conductive means comprise any electrical conductive ink or any ink comprising an electrical conductor. According to the present invention it is advantageously possible to easily install electrical conductors into the roof area of the vehicle, to reduce the weight of the roof structure and to prevent electrical short circuits. A further embodiment of the present invention comprises a vehicle headliner comprising a headliner substrate and a wire harness on the headliner wherein the wire harness is a pattern of electrical connections printed on the headliner. In further preferred embodiments, the wire harness may be printed using a conductive ink on any of the various layers of the headliner such as, for example, the B side of the cover layer, either side of the headliner substrate layer, or on a scrim layer. In various embodiments, an insulating layer is included over the wire harness.

In a further preferred embodiment this invention relates to a vehicle headliner comprising a wire harness including contact strips wherein the wire harness and contact strips are printed on the headliner. In further preferred embodiments, the contact strips comprise patches of conductive ink printed on a headliner component.

This invention further relates to a method for manufacturing a roof structure in a vehicle, wherein electrical connection means are printed on the roof structure. A preferred embodiment comprises a method for manufacturing a wire harness and headliner, comprising printing the wire harness circuitry on a headliner component. In further preferred embodiments, the wire harness is printed using a conductive ink.

These and other features and advantages of various embodiments of systems and methods according to this invention are described in, or are apparent from, the following detailed descriptions of various exemplary embodiments of various devices, structures, and/or methods according to this invention.

BRIEF DESCRIPTION OF THE DRAWINGS

Various exemplary embodiments of the systems and methods according to the present disclosure will be described in detail, with reference to the following figures, wherein.

DETAILED DESCRIPTION

In various exemplary embodiments, this invention relates to a overhead systems with a wire harness for electrically connecting to components integrated into the headliner. For example, the wire harness may be formed by printing the wiring or circuitry on part of the headliner core using a conductive ink and methods for making the same. The wiring or circuitry may be printed either before or after the overhead system is fully assembled. The wiring or circuitry may be printed in various parts of the overhead system, including, for example, on a scrim layer, on a substrate layer, or on a film attached to overhead systems. The overhead systems of this invention are produced at a lower cost, require less space, and weigh less than conventional overhead systems (e.g., headliners and wire harnesses) due to the reduced cost, size, and weight of the wire harness.

In various exemplary embodiments, the wire harness is incorporated into a film layer that is attached to or otherwise incorporated into the headliner. For example, the wire harness could be formed from flex circuits attached to an overhead systems component.

Figure 1:
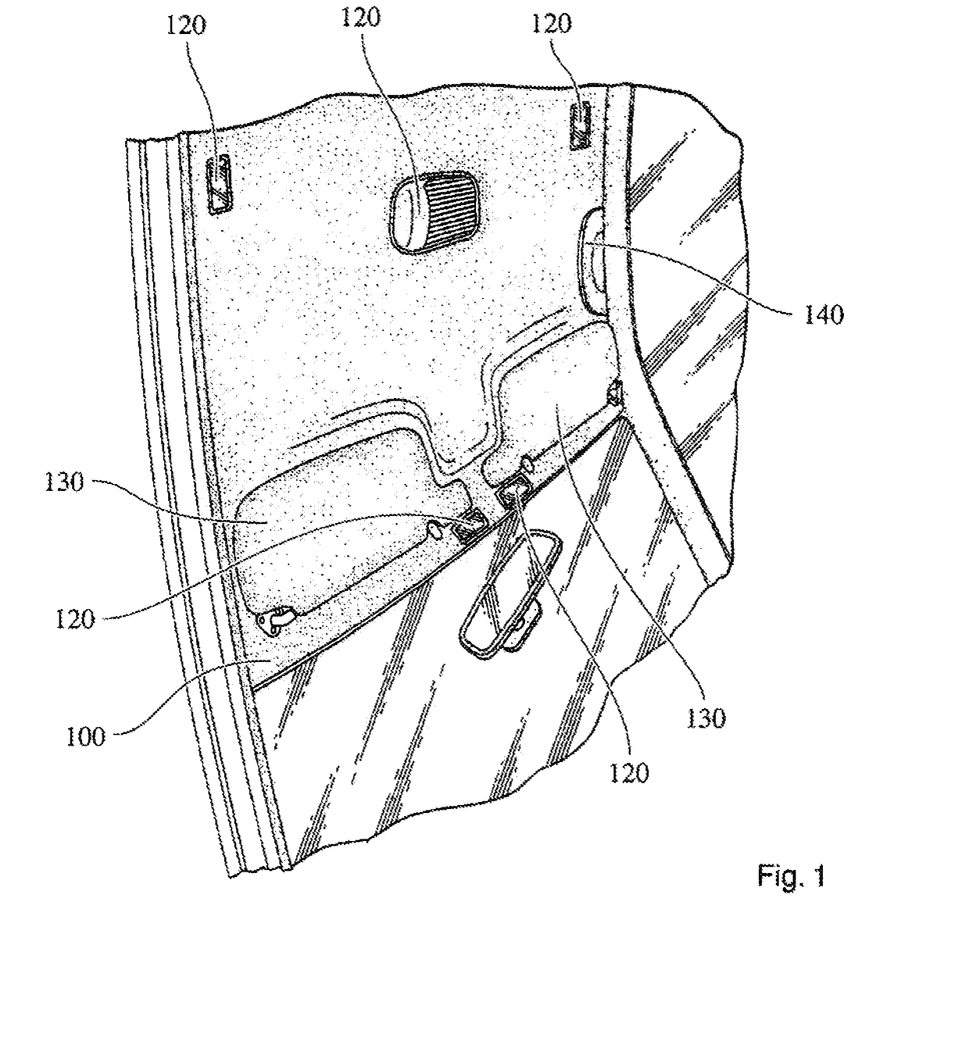
FIG. 1 is a partial perspective view of the interior of a vehicle.

FIG. 1 shows a partial view of the interior of a vehicle. In particular, FIG. 1 shows a portion of a headliner 100 adjacent to a front windshield. Various overhead system components are shown attached to or through the headliner 100, such as, for example, various lights 120, visors 130, and hand grips 140. Other components, such as, for example, a center overhead console, control buttons, etc. are also often attached to the headliner 100. Many of these components require electrical power and/or communication with a control to function. This power and/or communication is typically supplied with wires located behind the headliner 100.

Figure 2:
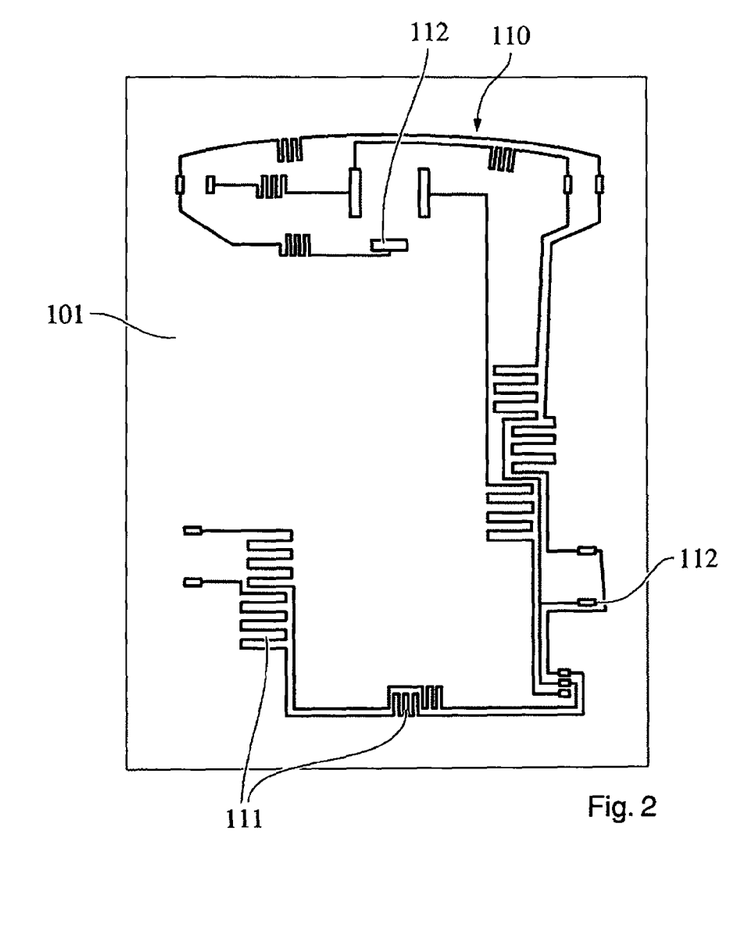
FIG. 2 is a top view of a first exemplary embodiment of a headliner substrate with an exemplary circuit on the headliner substrate according to this invention.
Figure 3:
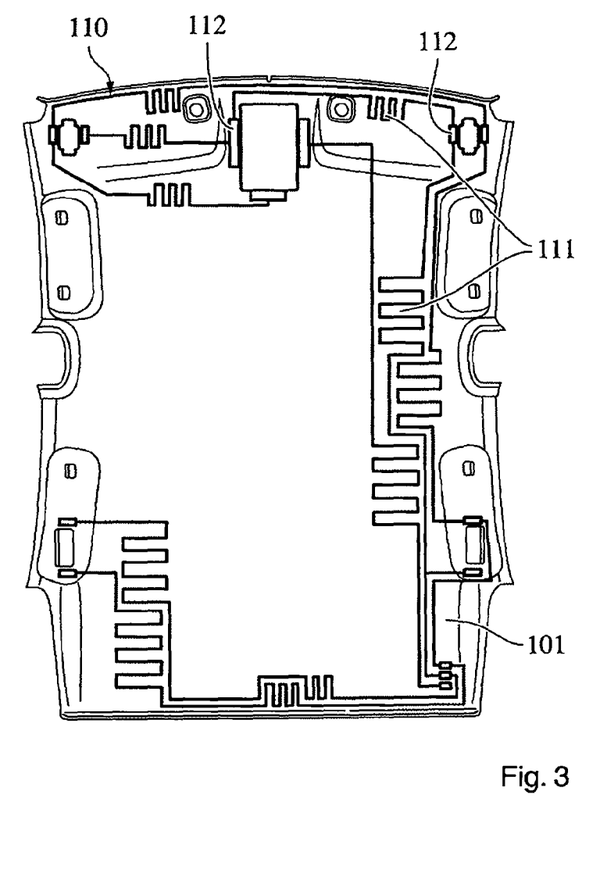
FIG. 3 is a top view of a first exemplary embodiment of a headliner according to this invention after being formed and trimmed, including the headliner substrate of FIG. 2.

FIG. 2 shows a first exemplary embodiment of a headliner substrate 101 with one exemplary embodiment of a printed wire harness 110 provided on the headliner substrate 101. In various embodiments, the printed wire harness 110 is applied to the headliner substrate 101 using a conductive ink. The ink may be applied by any method including, for example, painting, screen printing, inkjet printing, pad printing, transfer printing, or any other known or later-developed method. Strain relief circuits 111 and conductive pads 112 are provided at several locations on the headliner substrate 101. FIG. 3 shows the headliner substrate 101 of FIG. 2 after the headliner substrate 101 has been formed and trimmed to its final shape.

Figure 4:
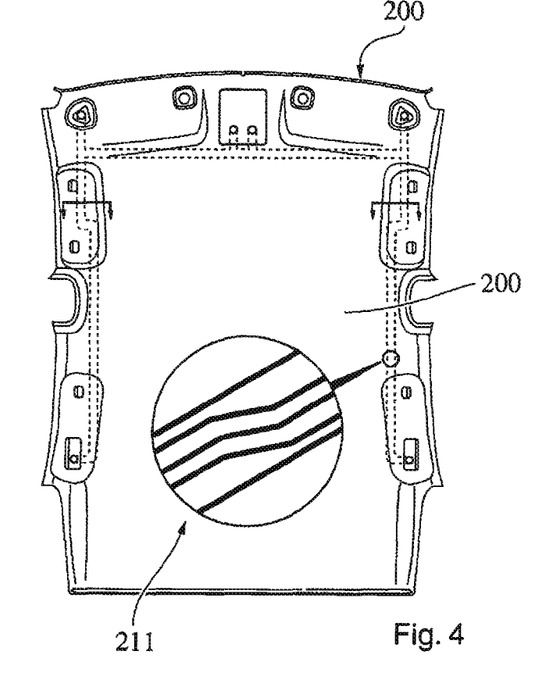
FIG. 4 is a top view of a headliner according to this invention.
Figure 5:
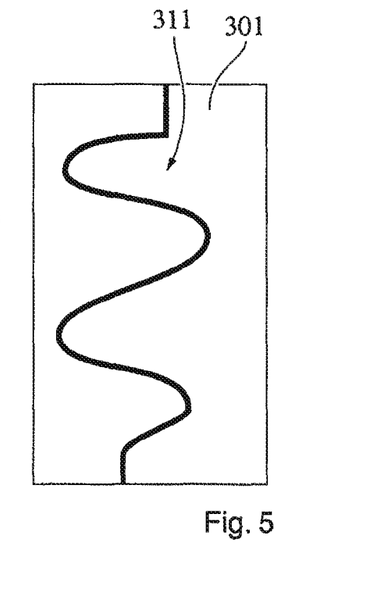
FIG. 5 is a top view of an exemplary embodiment of a strain relief circuit according to this invention.

FIG. 4 shows another embodiment of a headliner 200 according to this invention. It should be noted that forming the headliner substrate 201 to its final shape can involve stretching all or part of the headliner substrate 201. Stretching the substrate material underlying the wire harness 210 may result in breaks in the wire harness 210. The wire harnesses 110 shown in FIGS. 2 and 3 and 210 shown in FIG. 4 include strain relief circuits 111 and 211 that will retain their integrity during and after the underlying headliner 201 substrate 101 are stretched. FIG. 5 illustrates another embodiment of a strain relief circuit 311. The curved strain relief circuit 311 shown in FIG. 5 can withstand common amounts of stretching of the underlying headliner substrate 101 and/or 201 to which the headliner substrate 101 is subjected during installation without breaking the connection. Although FIG. 5 shows the strain relief circuit 311 with dramatic switchback curves, narrower or shallower curves may be used, depending on the extent to which the headliner substrate 301 will be stretched during subsequent handling. As outlined above with respect to FIGS. 2 and 3, the strain relief circuits 111 can be provided at one or more locations on the headliner substrate 101.

Figure 6:
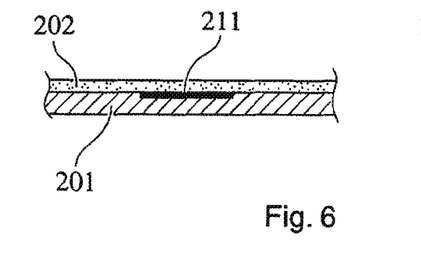
FIG. 6 is a partial cross-sectional view of a first exemplary embodiment of a headliner according to this invention taken along the line 6-6 in FIG. 4.
Figure 7:
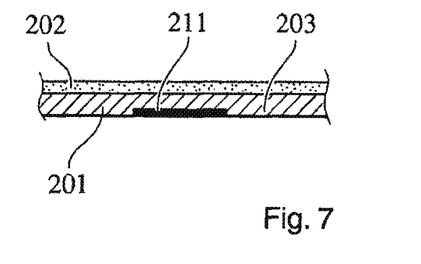
FIG. 7 is a cross-sectional view of a second exemplary embodiment of a headliner according to this invention.

In various exemplary embodiments, the wire harness 210 may be located on various surfaces within a headliner 200. In an exemplary embodiment, shown on FIG. 6, the wire harness 210 is placed on the B side of the headliner substrate 201 (i.e., the side of the substrate adjacent to the fabric layer). In another exemplary embodiment shown in FIG. 7, the wire harness 210 is placed on the C side of the headliner substrate 201 and covered by a scrim layer 202, which may be used to insulate the wire harness 210 from contact with the vehicle body. In various other exemplary embodiments, the wire harness 210 may be covered and/or insulated by a thin film layer and/or a sprayed-on layer, rather than a scrim layer 202.

Figure 8:
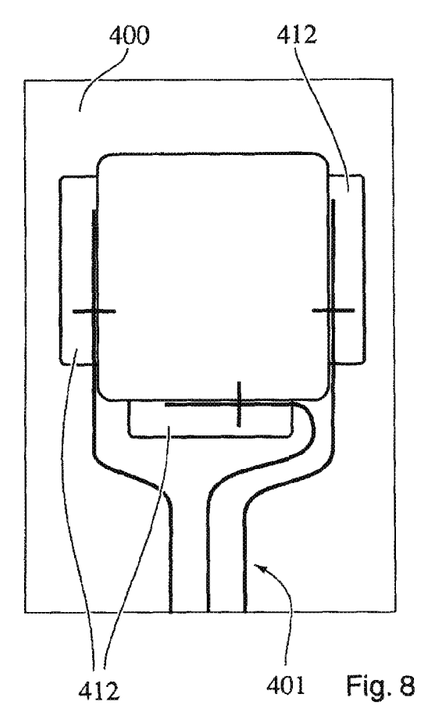
FIG. 8 is a top view of an exemplary embodiment of circuitry for a connection point according to this invention.
Figure 9:
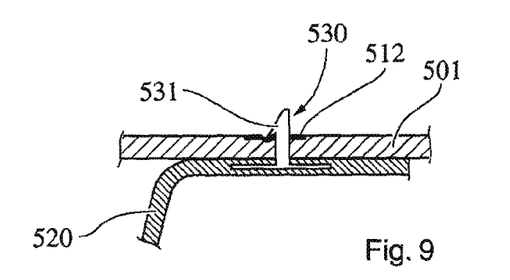
FIG. 9 is a cross-sectional view of a first exemplary embodiment of an electrical coupler according to this invention.
Figure 10:
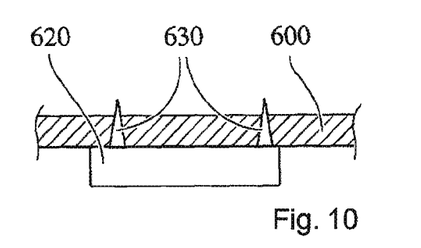
FIG. 10 is a cross-sectional view of a second exemplary embodiment of an electrical coupler according to this invention.
Figure 11:
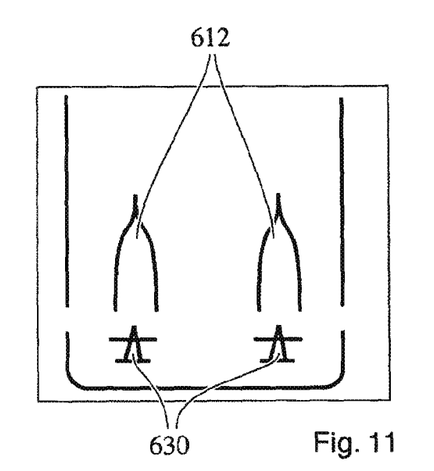
FIG. 11 is a perspective view of the electrical coupler shown in FIG. 10.

FIG. 8 shows a section of a wire harness 410 according to this invention at a point in the headliner 400 where a headliner component is electrically connected to the wire harness 410. As shown in FIG. 8, one or more conductive pads 412 are provided along the wire harness 410 at or near where the headliner component (not shown) will be attached to the wire harness 410. The conductive pads 410 act like "targets" for connecting components. FIG. 9 illustrates one exemplary embodiment of an electrical connector 530 that creates an electrical connection between the conductive pad 512 and a headliner component 520. As shown in FIG. 9, a conductive pad 512 is located on the headliner substrate 501. The electrical connector 530 is designed to pierce the headliner fabric 503, the headliner substrate 501, and the conductive pad 512. The electrical connector 530 includes a hook 531 that prevents the electrical connector 530 from separating from the headliner substrate 501 after installation. As shown in FIGS. 9 to 11, a headliner component (not shown) includes one or more connectors (not shown) that pierce the headliner 400 and contact the conductive pads 412. In various exemplary embodiments, the connectors (not shown) may pierce the headliner core to reach the conductive pads 412. The electrical connector 530 is a conductor that electrically couples the conductive pad 512 to the headliner component 520. As outlined above with respect to FIGS. 2 and 3, the conductive pad 112 can be provided at one or more locations on the headliner substrate 101.

FIGS. 10 and 11 show a second exemplary embodiment of an electrical connector 630 that provides an electrical connection between the integral wire harness (not shown) and a headliner component 620. Headliner component 620 includes electrical connectors 630. The electrical connectors 630 pierce through the headliner 600 to contact the connector pads (not shown). In various exemplary embodiments, the electrical connectors 630 and/or other connectors secure the component 620 to the headliner 600.

Figure 12:
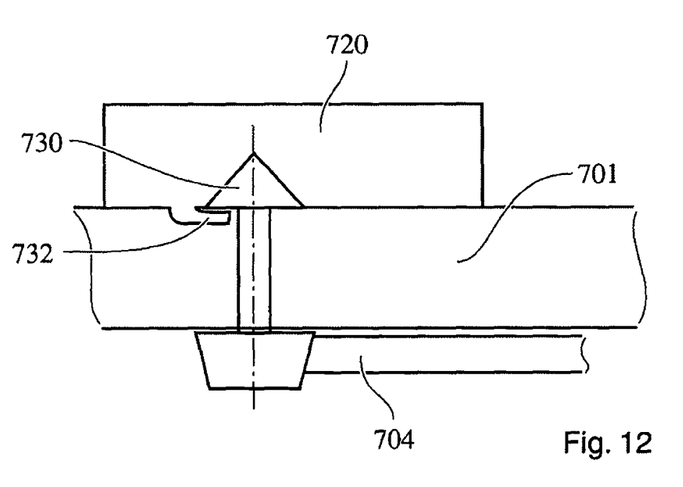
FIG. 12 is a cross-sectional view of a third exemplary embodiment of an electrical coupler according to this invention.
Figure 13:
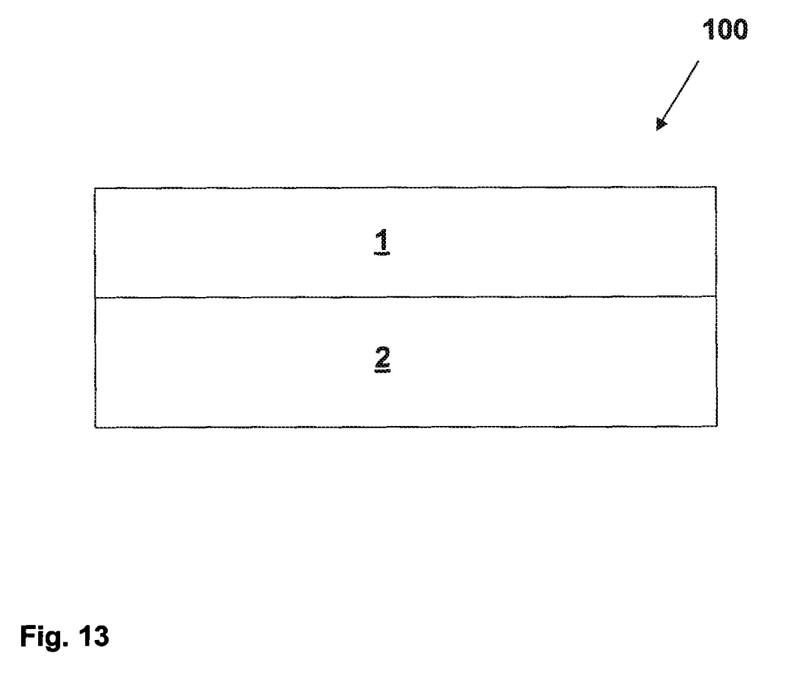
FIG. 13 shows schematically a part of a roof structure according to the present invention.
Figure 14:
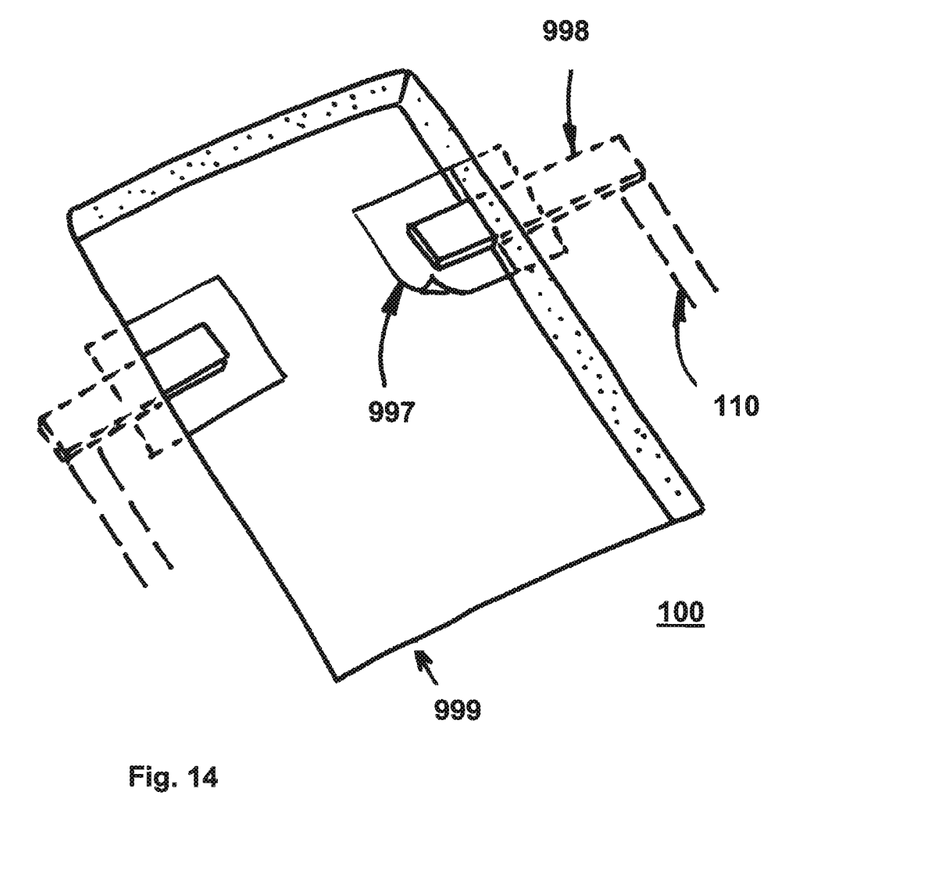
FIG. 14 shows schematically a further embodiment of the present invention.

FIG. 12 illustrates another embodiment of a connector that provides an electrical connection between a headliner component 120 and the wire harness 710. In various exemplary embodiments, the wire harness (not shown) is preprinted on a carrier product, 704 such as, for example, thermoplastic film, non-woven scrim, or paper sheet, which is attached to the headliner substrate 701. The headliner substrate 701 comprises e.g. a thermoplastic material with a thickness of about 3 mm. A connector 730, which comprises e.g. a copper material or an aluminium material, is placed in the headliner substrate 701. The connector 730 may be inserted after the headliner 700 is formed or during formation of the headliner substrate 701, such as, for example, by insert molding. A portion of the connector 730 extends through the headliner fabric 703. In various exemplary embodiments, the connector 730 is adapted to be coupled to a headliner component 720. In the embodiment shown in FIG. 12, the connector 730 is coupled to the headliner component 720 with a spring detent mechanism 732, but any known or later-developed attaching device, structure or mechanism may be used instead of or in addition to, the detent spring 732. FIG. 13 shows schematically a roof structure according to a further embodiment of the present invention. The roof structure 100 comprises a printed connection means 1 and a substrate layer 2, on which the printed connection means 1 is applied. FIG. 14 shows schematically a roof structure according to a further embodiment of the present invention. Contact strips 998 of electrically conductive material are embedded in the headliner 100 during manufacturing such that they make contact with the printed circuit 110 and extend into a cutout area 999. The cutout area 999 is trimmed in such a way that the contact strip 998 is not broken, e.g. by die cutting or "kiss-cutting" to a controlled depth. A release film 997 prevents plastics or adhesive residue from adhering to the contact strip 998.

It should be noted that references to relative positions (e.g., "top" and "bottom") in this description are merely used to identify various elements as are oriented in the figures. It should be recognized that the orientation of particular components may vary greatly depending on the application in which they are used.

It should be understood that the drawings are not necessarily to scale. In certain instances, details that are not necessary to the understanding of the invention or render other details difficult to perceive may have been omitted. It should be understood, of course, that the invention is not necessarily limited to the particular embodiments illustrated herein.

It should be appreciated that the construction and arrangement of the wire harness, as shown in the various exemplary embodiments, is illustrative only. While the wire harness, according to this invention, has been described in conjunction with the exemplary embodiments outlined above, various alternatives, modifications, variations, improvements, and/or substantial equivalents, whether known or that are or may be presently unforeseen, may become apparent. Accordingly, the exemplary embodiments of the console according to this invention, as set forth above, are intended to be illustrative, not limiting. Various changes may be made without departing from the spirit and scope of the invention. Therefore, the description provided above is intended to embrace all known or later-developed alternatives, modifications variations, improvements, and/or substantial equivalents.

The invention claimed is:

1. A roof structure for use in a vehicle, the vehicle including a plurality of electrical devices and a vehicle roof, the roof structure comprising printed electrical connection means for connecting the electrical devices in the vehicle and a substrate layer having an inner surface directed towards the vehicle roof, wherein the electrical connection means are printed on the inner surface of the substrate layer using an electrically conductive ink.

2. The roof structure according to claim 1, wherein the roof structure comprises a cover layer overlying an outer surface of the substrate layer.

3. The roof structure according to claim 2, wherein the roof structure comprises a scrim layer between the vehicle roof and the substrate layer, and overlying the printed electrical connection means.

4. The roof structure according to claim 2, wherein the roof structure comprises an insulating layer, wherein the insulating layer is arranged between the substrate layer and the vehicle roof.

5. The roof structure according to claim 1, further comprising printed contact strips embedded in the substrate layer and in electrical contact with the electrical connection means.

6. The roof structure according to claim 5, wherein the contact strips comprise patches of conductive ink printed on the substrate layer.

7. The roof structure according to claim 1, further comprising strain relief means for withstanding stretching of the underlying roof structure during installation into the vehicle without breaking connection within the printed electrical connection means.

8. The roof structure according to claim 1, further comprising a printed conductive pad connectable with an electrical device and the printed electrical connection means.

9. The roof structure according to claim 1, wherein the printed electrical connection means are formed from flex circuits attached to the substrate layer.

10. The roof structure according to claim 1, wherein the electrical devices require electrical power to function.

11. A method for manufacturing a roof structure in a vehicle, the vehicle including a plurality of electrical devices, the method comprising:

printing electrical connection means on the roof structure using an electrically conductive ink; and piercing the roof structure with an electrical connector to connect one of the electrical devices to the electrical connection means.

12. A system comprising:

an electrical device;

a roof structure with printed electrical connection means and a printed conductive pad; and an electrical connector pierced through the roof structure to connect the electrical device with the conductive pad, wherein the electrical connection means are printed on the roof structure using an electrically conductive ink.

13. The system according to claim 12, wherein the electrical connector comprises a fixing means for preventing the electrical connector from separating from the roof structure during or after the installation of the roof structure.

14. A roof structure for use in a vehicle, the vehicle including a plurality of electrical devices and a vehicle roof, the roof structure comprising a printed wire harness for connecting the electrical devices in the vehicle and a substrate layer having an inner surface directed towards the vehicle roof, wherein the wire harness is printed on the inner surface of the substrate layer using an electrically conductive ink.

* * * * *